US010763864B2

(12) United States Patent
Goumballa et al.

(10) Patent No.: US 10,763,864 B2
(45) Date of Patent: Sep. 1, 2020

(54) VOLTAGE-CONTROLLED-OSCILLATOR CIRCUIT

(71) Applicant: NXP USA, INC., Austin, TX (US)

(72) Inventors: Birama Goumballa, Larra (FR); Pierre Savary, Muret (FR); Cristian Pavao Moreira, Frouzins (FR)

(73) Assignee: NXP USA, INC., Austin, TX (US)

( * ) Notice: Subject to any disclaimer, the term of this patent is extended or adjusted under 35 U.S.C. 154(b) by 21 days.

(21) Appl. No.: 16/145,782

(22) Filed: Sep. 28, 2018

(65) Prior Publication Data

US 2019/0181867 A1 Jun. 13, 2019

(30) Foreign Application Priority Data

Dec. 12, 2017 (EP) .................................... 17306752

(51) Int. Cl.
*H03L 1/02* (2006.01)
*G01S 7/03* (2006.01)
*H03L 7/099* (2006.01)
*H03L 7/089* (2006.01)

(52) U.S. Cl.
CPC .............. *H03L 1/023* (2013.01); *G01S 7/032* (2013.01); *H03L 7/0895* (2013.01); *H03L 7/099* (2013.01); *H03L 2207/06* (2013.01)

(58) Field of Classification Search
CPC ....... H03L 1/023; H03L 7/0895; H03L 7/099; H03L 2207/06; G01S 7/032
See application file for complete search history.

(56) References Cited

U.S. PATENT DOCUMENTS

| 4,667,170 | A | 5/1987 | Lofgren et al. |
| 7,612,626 | B2 | 11/2009 | Tang |
| 8,466,750 | B2 * | 6/2013 | Chiu .................... H03B 5/1228 331/117 FE |
| 8,749,316 | B2 | 6/2014 | Rangarajan et al. |
| 9,843,255 | B1 | 12/2017 | Goumballa et al. |
| 2012/0249249 | A1 | 10/2012 | Shen |
| 2014/0354365 | A1 * | 12/2014 | Gao ........................ H03L 1/023 331/70 |
| 2016/0072463 | A1 | 3/2016 | Camilleri |
| 2017/0005617 | A1 | 1/2017 | Trotta |
| 2017/0358329 | A1 | 12/2017 | Goumballa et al. |

FOREIGN PATENT DOCUMENTS

WO 2013149636 A1 10/2013

* cited by examiner

*Primary Examiner* — Jeffrey M Shin

(57) ABSTRACT

The disclosure relates to voltage-controlled-oscillator circuit comprising: a charge-pump configured to generate a tuning-voltage, the tuning-voltage having a minimum-operating-voltage; an offset-voltage-source configured to generate an offset-voltage in accordance with the minimum-operating-voltage; and a voltage-controlled-oscillator, VCO, configured to provide an oscillator frequency in accordance with the tuning-voltage and the offset-voltage.

20 Claims, 6 Drawing Sheets

VOLTAGE-CONTROLLED-OSCILLATOR CIRCUIT

CROSS-REFERENCE TO RELATED APPLICATIONS

This application claims the priority under 35 U.S.C. § 119 of European Patent application no. 17306752.1, filed on 12 Dec. 2017, the contents of which are incorporated by reference herein.

The present disclosure relates to a voltage-controlled-oscillator circuit and in particular, although not exclusively, to a voltage-controlled-oscillator circuit for a phase-locked loop system in a radar transceiver.

Radar transceivers are widely used in automotive applications, for example in impact detection and driver assistance systems. In some applications, it is desirable to provide a radar transceiver that operates in multiple frequency bands. For example, a dual band radar transceiver may operate at 76 to 77 GHZ and at 77 to 81 GHZ. A dedicated voltage controlled oscillator (VCO) may be provided to implement each of the operational frequency bands of the radar transceiver through a frequency synthesizer based on phase-locked loop (PLL).

It is desirable in some applications to be able to switch in real time from one operating frequency band to another, which is difficult or infeasible using two VCOs due to timing and frequency alignment issues.

According to a first aspect of the present disclosure there is provided a voltage-controlled-oscillator circuit comprising:
 a charge-pump configured to generate a tuning-voltage, the tuning-voltage having a minimum-operating-voltage;
 an offset-voltage-source configured to generate an offset-voltage in accordance with the minimum-operating-voltage; and
 a voltage-controlled-oscillator, VCO, configured to provide an oscillator frequency in accordance with the tuning-voltage and the offset-voltage.

The present disclosure addresses the above problems by compensating for the minimum-operating-voltage of the charge-pump within the VCO. In this way, an operating constraint of the charge-pump which would otherwise limit the operating frequency range of the VCO is alleviated. The result is that the operating range of the VCO may be extended so a single VCO may be used to cover multiple operating frequency bands. For example, the VCO may be used for a frequency range that covers both frequency bands 76-77 GHZ and 77-81 GHZ. That is, the voltage-controlled-oscillator circuit enables a radar transceiver to be provided with a single PLL and/or single VCO for selecting the operating frequency. In this way, the complexity of the radar transceiver and the bill of materials (BOM) may be reduced by implementing the voltage-controlled-oscillator circuit.

In one or more embodiments, the voltage-controlled-oscillator comprises at least one varactor unit. A varactor-voltage based on the offset-voltage may be applied across a varactor of the at least one varactor unit.

In one or more embodiments, the varactor-voltage is based on a difference between the tuning-voltage and the offset-voltage.

In one or more embodiments, each of the at least one varactor units comprises a pair of opposing-polarity varactors.

In one or more embodiments, the voltage-controlled-oscillator has a minimum-VCO-voltage. The offset voltage may be based on a difference between the minimum-VCO-voltage and the minimum-operating-voltage of the tuning-voltage.

In one or more embodiments, the voltage-controlled-oscillator has a maximum-VCO-voltage. The voltage-controlled-oscillator circuit may comprise a high-voltage-supply configured to provide a high-voltage to the charge-pump. The high-voltage may be based on a sum of the maximum-VCO-voltage and the offset-voltage.

In one or more embodiments, the high-voltage is larger than the sum of the maximum-VCO-voltage and the offset-voltage. The offset-voltage may be larger than a difference between the minimum-operating-voltage and the minimum-VCO-voltage.

In one or more embodiments, the offset-voltage-source comprises a low-noise-regulator.

In one or more embodiments, further comprising a temperature-compensation-circuit configured to provide a temperature-compensation-voltage to the voltage-controlled-oscillator.

In one or more embodiments, the temperature-compensation-voltage is provided to a different varactor-unit to the tuning-voltage.

In one or more embodiments, the offset-voltage is a first-offset-voltage. The offset-voltage-source may be further configured to generate a second-offset-voltage in accordance with a temperature-compensation-minimum-operating-voltage of the temperature-compensation-circuit. The offset-voltage-source may be configured to provide the first-offset-voltage to a different varactor unit to the second-offset-voltage.

In one or more embodiments, the first-offset-voltage and the second-offset-voltage are fixed DC voltages.

According to a further aspect there is provided a phase-locked loop (PLL) system comprising:
 a phase-comparator; and
 the voltage-controlled-oscillator circuit. The charge-pump may be configured to provide the tuning-voltage based on an input-voltage received by the charge pump. The input-voltage may be based on an output-signal from the phase-comparator.

According to a further aspect there is provided a radar transceiver comprising the PLL system. The radar transceiver may have a single VCO for operating within either a first frequency band or a second frequency band.

In one or more embodiments, the VCO has an oscillator-frequency-range of 5 GHz or more.

While the disclosure is amenable to various modifications and alternative forms, specifics thereof have been shown by way of example in the drawings and will be described in detail.

It should be understood, however, that other embodiments, beyond the particular embodiments described, are possible as well. All modifications, equivalents, and alternative embodiments falling within the spirit and scope of the appended claims are covered as well.

The above discussion is riot intended to represent every example embodiment or every implementation within the scope of the current or future Claim sets. The figures and Detailed Description that follow also exemplify various example embodiments. Various so example embodiments may be more completely understood in consideration of the following Detailed Description in connection with the accompanying Drawings.

One or more embodiments will now be described by way of example only with reference to the accompanying drawings in which.

NXP's 'Eagle' dual-band (76-77 GHz & 77-81 GHz) automotive radar transceiver uses two voltage-controlled-oscillators (VCOs) in its main phase-locked loop (PLL) system to enable operation across both frequency bands. Two dedicated VCOs allow tuning range and phase noise requirements to be fulfilled for a range of applications. The two VCOs are independently laser trimmed to cover the respective frequency bands. As will be described further below with reference to FIG. 2b, the implementation of a charge pump to provide a tuning-voltage Vtune results in an operation constraint that the tuning-voltage Vtune has a minimum-operating-voltage, below which the charge pump (and the PLL) may not operate properly. In some examples, minimum-operating-voltage is about 0.6 V. The minimum-operating-voltage constraint placed on the tuning-voltage during laser trim has some drawbacks:

it generates yield loss at probe level;

it limits the operating range of each respective band due to the loss of 0.6V minimum value (which results in a reduction in bandwidth of ~1.8 GHz for the PLL) and an interrupt could be generated by undershoot of the PLL, in particular at a low tuning-voltage (before Calibration).

Figure 1:
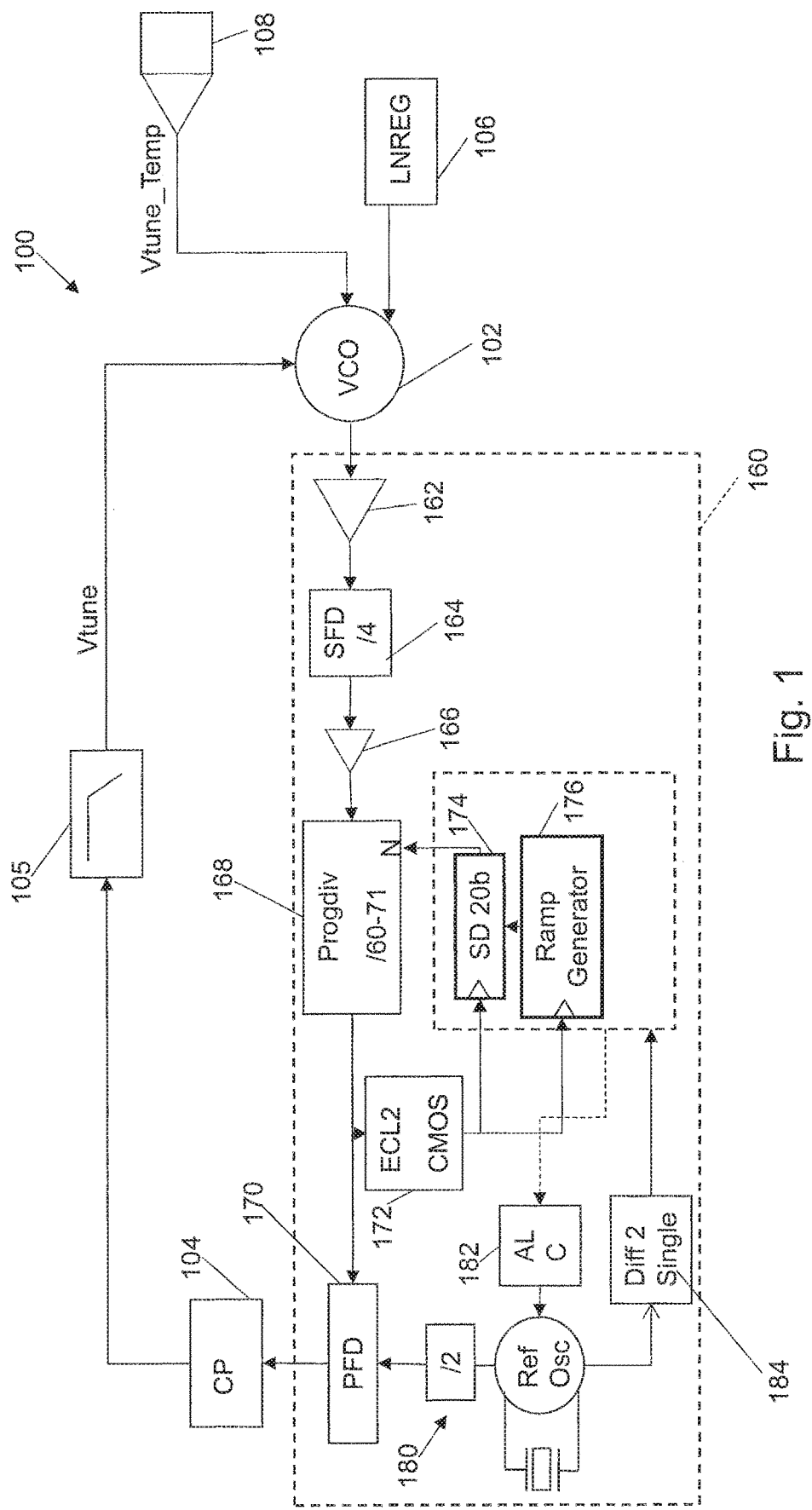
FIG. 1 shows an example embodiment of a phase locked loop (PLL) system comprising a voltage controlled oscillator circuit.

Some aspects of the present disclosure address problems encountered in a phase-locked loop (PLL) system of a radar transceiver comprising a phase-comparator and a charge-pump for driving a voltage-controlled-oscillator (VCO). The charge-pump is configured to provide a tuning-voltage to the voltage-controlled-oscillator based on an output-signal from the phase-comparator. The minimum-operating-voltage of the tuning-voltage is a practical limitation to provide correct functioning of the circuit in some implementations. In the example embodiments of FIGS. 1, 2a and 2b, an offset voltage is applied within the VCO in order to compensate for the minimum-operating-voltage FIG. 1 illustrates a phase locked loop (PLL) system 100 comprising a VCO circuit. The VCO circuit comprises a voltage controlled oscillator (VCO) 102, a charge pump 104, an offset voltage source 106 and a temperature compensation circuit 108, amongst other things.

The offset voltage source 106 and the temperature compensation circuit 108 provide inputs to the VCO 102. The charge pump 104 is provided within the loop of the phase locked loop system 100. The charge pump is configured to convert an input voltage Vb associated with a phase difference of the PLL system to a tuning voltage Vtune. The tuning voltage is provided to the VCO 202 via a low pass filter 105. The low pass filter 105 may also be considered to be a component of the charge pump 104.

The operation of the VCO circuit is described further below with reference to FIG. 2.

In addition to the previously described voltage controlled oscillator circuitry, the phase locked loop system 100 further comprises standard PLL components 160. The standard PLL components 160 include further components within the PLL loop between an output of the VCO 102 and the input of the charge pump 104. Such components include a first amplifier 162, a static frequency divider (SFD) 164, a second amplifier 166, a programmable frequency divider 168, and a PFD 170 provided in series between the VCO 102 and the charge pump 104. The output of the programmable frequency divider 168 is also provided to an ECL to CMOS converter unit 172 to drive the digital controller. The ECL to CMOS converter unit provides a signal to a sigma delta modulator 174 and a ram generator 176. The sigma delta modulator 174 is also controlled by an output of the ramp generator 176. The output of the sigma delta modulator 174 is fed back to the programmable frequency divider 168.

A reference oscillator signal is also fed to the PFD 170 from a reference oscillator 180. The reference oscillator 180 also receives a control signal from the digital controller via an ALC unit 182. A signal from the reference oscillator 180 is also fed back to the digital controller by a differential to signal unit 184 for timing generation.

Figure 2A:
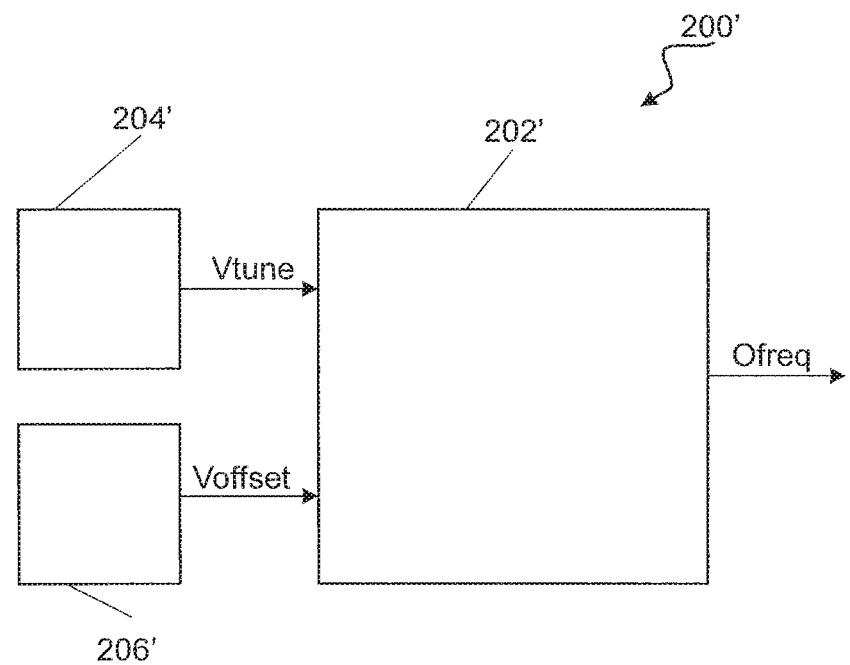
FIG. 2a shows a schematic block diagram of an example embodiment of a voltage-controlled-oscillator-circuit for a PLL system.

FIG. 2a illustrates a schematic block diagram of a voltage-controlled-oscillator-circuit 200' for a phase-locked-loop (PLL) system. The voltage-controlled-oscillator circuit 200' comprises a voltage-controlled-oscillator (VCO) 202', a charge-pump 204' and an offset-voltage-source 206'.

The charge-pump 204' is configured to generate a tuning-voltage Vtune. The tuning-voltage Vtune has a minimum-operating-voltage, which is a practical limitation of the charge-pump 204'.

The offset-voltage-source 206' is configured to generate an offset-voltage Voffset in accordance with the minimum-operating-voltage. For example, the offset-voltage Voffset may be set at the same magnitude as the minimum-operating-voltage.

The VCO 202' has a minimum-VCO-voltage and a maximum-VCO-voltage, defining a tuning-range Vrange. The tuning-voltage Vtune is selected to take a value between the minimum-VCO-voltage and a maximum-VCO-voltage. The maximum-VCO-voltage is managed by trimming the supply voltage VCC_HV in the charge-pump 204' while preventing the avalanche noise multiplication by tuning the input voltage Vb during the calibration. Indeed, depending on the Vtune voltage, the input voltage of the charge pump Vb is adjusted to reduce the VCE of the last stage of the charge pump 204'.

An oscillator-frequency of a typical VCO is based on the tuning-voltage Vtune. However, the minimum-operating-voltage is typically greater than the minimum-VCO-voltage, which results in a loss of operating range. In the present case, the VCO 202' is configured to provide an oscillator-frequency in accordance with the offset-voltage Voffset, in addition to the tuning-voltage Vtune. In this way, the minimum-operating-voltage of the charge-pump 204' can be compensated for using the offset-voltage Voffset provided by the offset-voltage-source 206', resulting in an increase in an operating range of the oscillator frequency Ofreq provided by the VCO 202'.

The tuning range of a given PLL system is increased by solving the low and high Vtune limits: the lower limit is generally dictated by the charge pump, higher limit by the max Vtune voltage required to be generated. The technique is based on shifting the Vtune range to higher values, the lower limit being the minimum charge pump limit (Vcp) and the maximum Vtune generated by a power supply. For max Vtune generation, the charge pump being adapted to prevent the avalanche noise multiplication by tuning the input voltage Vb during the calibration. Indeed, depending on the Vtune voltage, the input voltage of the charge pump Vb is adjusted to reduce the VCE of the last stage of the charge pump 204'. This proposal allows to remove the yield loss associated with the min Vtune constraint of the PLL to be reduced.

The operation of the voltage-controlled-oscillator-circuit is further explained below with reference to the example illustrated in FIG. 2b, as well as profiles illustrating the performance of such a circuit in FIGS. 3 and 4.

Figure 2C:
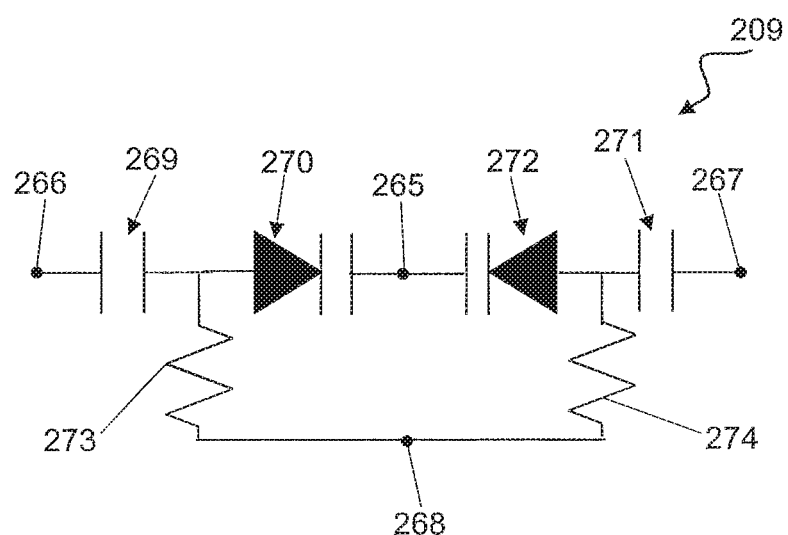
FIG. 2c shows a circuit diagram for a varactor-unit for use in the VCO illustrated in FIG. 2b.
Figure 2B:
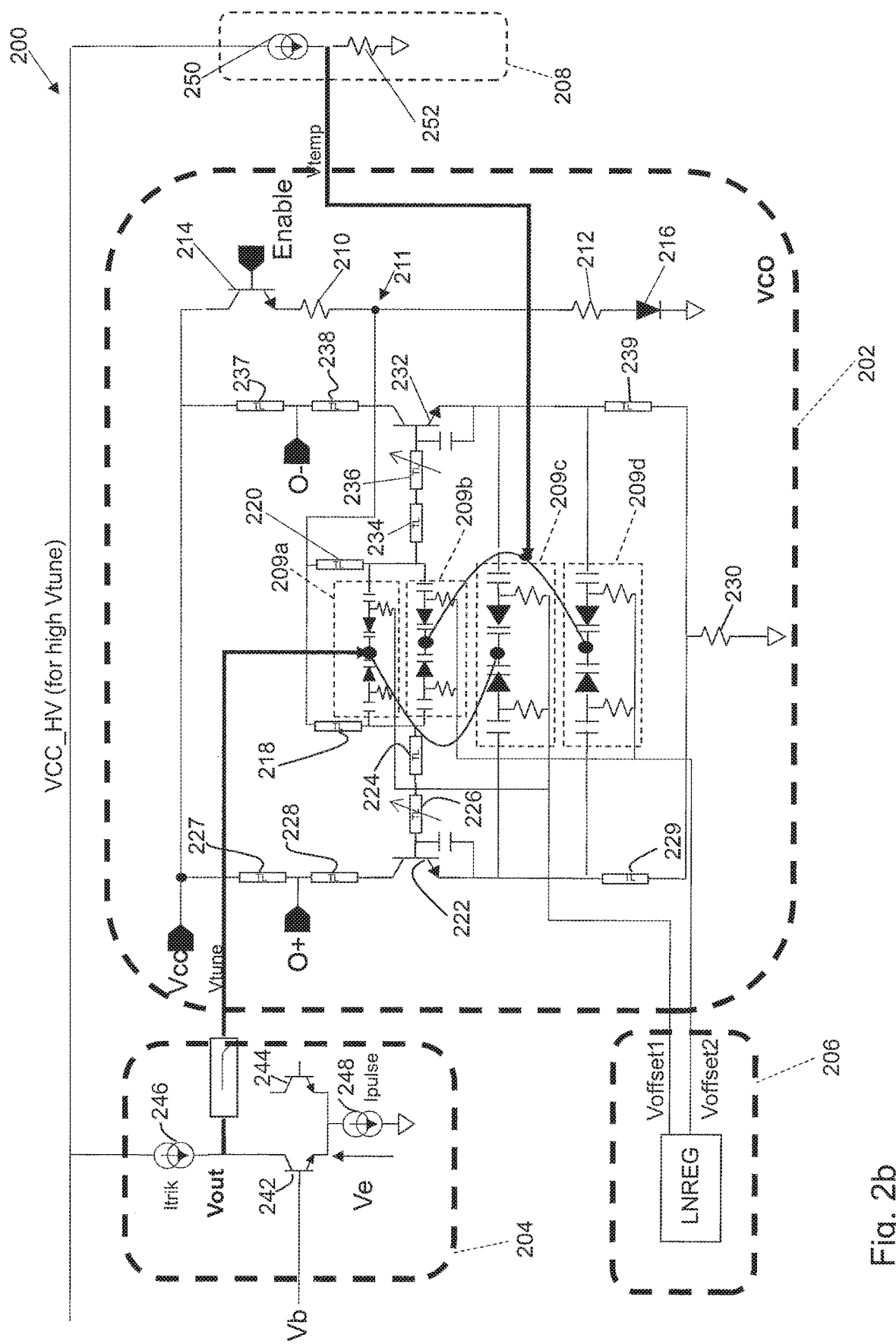
FIG. 2b shows a schematic block diagram of an example embodiment of a voltage-controlled-oscillator-circuit for a PLL system.

FIG. 2b illustrates a circuit diagram for a specific example of a voltage-controlled-oscillator-circuit 200 for a phase-locked-loop (PLL) system. The voltage-controlled-in oscillator-circuit 200 comprises a voltage-controlled-oscillator (VCO) 202, a charge-pump 204, an offset-voltage-source 206 and a temperature-compensation-circuit 208.

The VCO 202 comprises four varactor-units 209a-d. Each varactor-unit 209a-d comprises four terminals.

FIG. 2c illustrates a varactor-unit 209 for use in the VCO illustrated in FIG. 2b. A first capacitor 269 is provided in series with a first varactor 270 between a first terminal 265 and a second terminal 266 of the varactor-unit 209. A second capacitor 271 is provided in series with a second varactor 272 between the first terminal 265 and a third terminal 267 of the varactor-unit 209. A polarity of the first varactor 270 opposes a polarity of the second varactor 272. In this example, respective cathodes of the first and second varactor units 270, 272 are directly connected to the first terminal 265. A node between the first capacitor 269 and the first varactor 270 is coupled to a fourth terminal 268 via a first load 273. A node between the second capacitor 271 and the second varactor 272 is coupled to the fourth terminal 268 via a second load 274.

Returning to FIG. 2b, the second and third terminals of the first and second varactor-units 209a, 209b are indirectly coupled to a power source.

In this example, a potential divider circuit is provided between VCC and ground. The potential divider circuit comprises a conduction channel of an enable/disable transistor 214, a first divider load 210, a second divider load 212 and a forward bias diode 216 provided in series. The enable/disable transistor 214 provides a means to enable or disable the VCO 202. A node 211 of the potential divider circuit between the first and second divider loads 210, 212 is coupled to the second terminals of the first and second varactor-units 209a, 209b via a first transmission line 218. The node 211 is also coupled to the third terminals of the first and second varactor-units 209a, 209b via a second transmission line 220.

A first output (O+) of the VCO 202 is provided in accordance with signals at the second terminals of the varactor-units 209a-d. In this example, signals from the varactor-units 209a-d are combined on a first output path, comprising a first output transistor 222. A capacitance is provided between a base and emitter of the first output transistor 222. The base of the first output transistor 222 is connected to the second terminal of the first and second varactor-units 209a, 209b via a third transmission line 224 coupled in series with a first variable transmission line 226 which is used to laser trim and recenter the frequency of the VCO. A collector of the first output transistor 222 is coupled to VCC via fourth and fifth transmissions lines 227, 228. The first output signal is obtained at a node between the fourth and fifth transmissions lines 227, 228. A sixth transmissions line couples the emitter of the first output transistor 229 to ground via a ground load 230. The second terminals of the third and fourth varactor-units 209c, 209d are connected to the emitter of the first output transistor 222.

A second output (O−) of the VCO 202 is provided in accordance with signals at the third terminals of the varactor-units 209a-d. In this example, signals from the varactor-units 208a-d are combined on a second output path, comprising a second output transistor 232. A capacitance is provided between a base and emitter of the second output transistor 232. The base of the second output transistor 232 is connected to the third terminal of the first and second varactor-units 209a, 209b via a seventh transmission line 234 coupled in series with a second variable transmission line 236 which is used to laser trim and recenter the frequency of the VCO. A collector of the second output transistor 232 is coupled to VCC via eighth and ninth transmissions lines 237, 238. The second output signal is obtained at a node between the eighth and ninth transmissions lines 237, 238. A tenth transmissions line couples the emitter of the second output transistor 239 to ground via a ground load 230. The third terminals of the third and fourth varactor-units 209c, 209d are connected to the emitter of the second output transistor 232, The charge-pump is configured to convert an input voltage Vb, which may be associated with a phase difference of the PLL system, to a tuning voltage Vtune. The tuning voltage Vtune is provided to the first terminals of the first and third varactor-units 209a, 209c of the VCO 202.

In this example, the charge-pump 204 comprises a first charge-pump transistor 242 and a second charge-pump transistor 244. The first charge-pump transistor 242 and second charge-pump transistor 244 provide a differential pair of transistors. A base of the first charge-pump transistor 242 is configured to receive the input voltage Vb. The input voltage Vb can vary, which shifts at the same time an emitter voltage Ve of the first charge-pump transistor 242. Indeed, the PLL integrates a calibration mechanism which measured Vtune and adjust the input voltage Vb. When Vtune is high, Vb is shifted up and thus Ve reducing the voltage VCE of the xHBT.

The collector of the first charge-pump transistor 242 is connected to a 'high-voltage' VCC_HV (which may be of the order of 5 V, for example) via a first charge-pump current-source 246. The tuning-voltage Vtune is provided as an output of the charge-pump 204 by a low-pass-filter 205 connected to the collector of the first charge-pump transistor 242.

An emitter of the first charge-pump transistor 242 is connected to an emitter of the second charge-pump transistor 244. The emitters of the first and second charge-pump transistors 242, 224 are coupled to ground via a second charge-pump current-source 248.

In this example, the offset-voltage-source 206 is provided by a low noise regulator (LNR). The offset-voltage-source 206 is configured to provide a first-offset-voltage Voffset1 and a second-offset-voltage Voffset2. The LNR may provide the first-offset-voltage Voffset1 and second-offset-voltage Voffset2 with an output noise level that is is in a range of few nVs (nanovolt) such as less than 10 or 20 nVs, for example. The first-offset-voltage Voffset1 may be equal to, or different from, the second-offset-voltage Voffset2.

The minimum-VCO-voltage is typically 0 V. In the case that the minimum-VCO-voltage is 0V, for the example shown, the first-offset-voltage Voffset1 is selected to be equal to the minimum-operating-voltage of the tuning-voltage Vtune. In the case that the minimum-VCO-voltage is not 0V, for the example shown, the first-offset-voltage Voffset1 is selected to be equal to a difference between the minimum-operating-voltage of the tuning-voltage Vtune and the minimum-VCO-voltage.

The high-voltage VCC_HV may be based on a sum of the maximum-VCO-voltage and the offset-voltage. For example, the high-voltage VCC_HV may be greater than or equal to (maximum-VCO-voltage−minimum-VCO-voltage+first-offset-voltage Voffset1).

The first-offset-voltage Voffset1 is provided to the fourth terminals of the first and third varactor-units 209a, 209c. The first-offset-voltage Voffset1 and the tuning-voltage Vtune are provided to the same varactor units. Respective varactor-voltages are provided across each of the varactors in the first and third varactor-units 209a, 209c. These varactor-voltages are based on a difference between the tuning-voltage and the offset-voltage. The effect of the application of the offset-voltage is therefore that the varactor-voltages are compensated for the minimum-operating-voltage of the tuning voltage. This compensation results in an increase in the dynamic range of the VCO, as discussed further below with reference to FIGS. 3 and 4.

In the example illustrated in FIG. 2b, the VCO circuit 200 further comprises a temperature-compensation-circuit 208 comprising a current-source 250 connected between the high-voltage VCC_HV and ground via a temperature-compensation-resistor 252. The VCO temperature compensation can compensate for any temperature variation of the voltages, capacitances and/or oscillation frequency of the VCO circuit 200. A temperature-compensation-voltage Vtemp is provided at a node between the current-source 250 and the temperature-compensation-resistor 252. The temperature-compensation-voltage Vtemp is provided to the first terminals of the second and fourth varactor-units 209b, 209d. In this way, the temperature-compensation-circuit 208 is configured to provide a temperature-compensation-voltage to the voltage-controlled-oscillator 202.

The offset-voltage-source 206 is configured to generate the second-offset-voltage Voffset2 in accordance with a temperature-compensation-minimum-operating-voltage of the temperature-compensation-circuit. The second-offset-voltage may be a fixed DC voltage. The second-offset-voltage Voffset2 is provided to the fourth terminals of the second and fourth varactor-units 209b, 209d. That is, the second-offset-voltage Voffset2 and the temperature-compensation-voltage Vtemp are provided to the same varactor units.

For safety reason, to guarantee the normal operation of the PLL, a Min safety Vtune (set to min voltage of the charge pump) may be defined. During calibration, the tuning voltage Vtune is measured and the result is compared to the Min Safety Vtune. If Vtune<=Min Safety Vtune then an interrupt is generated, indicating that there is a safety fault. At system level, a microcontroller unit can then reset the circuit considering that the received data are not valid.

Figure 3:
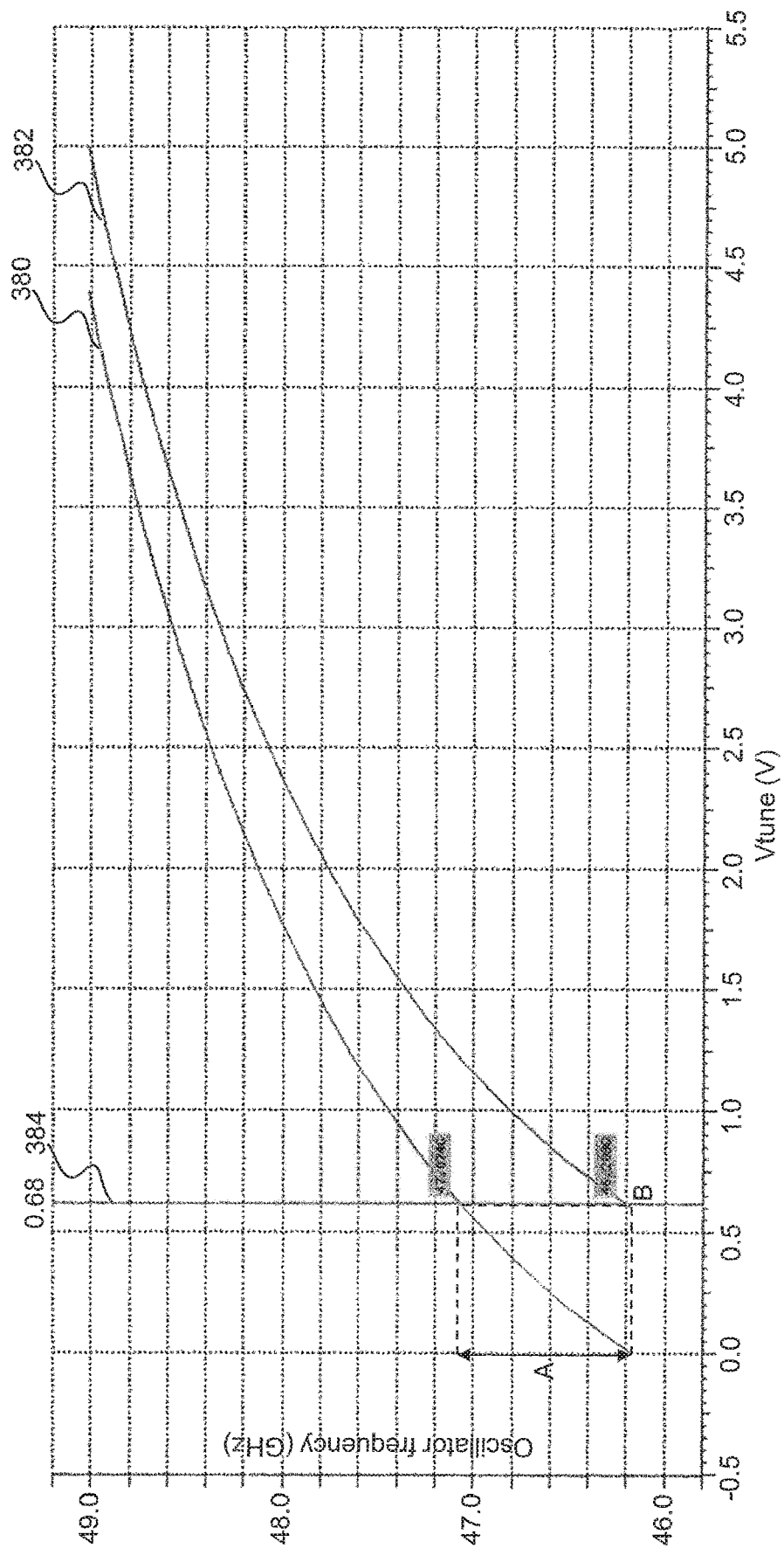
FIG. 3 shows simulated plots of VCO oscillator frequency versus charge pump tuning-voltages.

FIG. 3 illustrates a simulated plot of VCO oscillator frequency Ofreq versus charge pump tuning-voltage Vtune for: (i) a VCO circuit without varactor biasing 380 (that is, without compensation of the minimum-operating-voltage 384 of the charge pump); and (ii) the VCO circuit with varactor biasing 382 (that is, an offset-voltage-source providing an offset-voltage to the VCO to compensate for the minimum-operating-voltage 384 of the charge pump 382), as in a VCO circuit such as those described above in relation to FIGS. 1, 2a and 2b.

The minimum-operating-voltage 384 is indicated by a vertical line at approximately 0.62V. The VCO circuit without varactor biasing 380 has a minimum-tuning-voltage Vtune_min defined by the minimum-operating-voltage 384 (that is, 0.62 V). The minimum-tuning-voltage Vtune_min corresponds to an oscillator frequency of 47.1 GHz. A maximum-tuning-voltage Vtune-max is defined by a maximum-VCO-voltage, which in this example is approximately 4.4 V. The maximum-tuning-voltage Vtune_max corresponds to an oscillator frequency of 49 GHz. The minimum-tuning-voltage Vtune_min and the maximum-tuning-voltage Vtune_max therefore correspond to an oscillator-frequency-range of 47.1 GHz to 49 GHz (~1.9 GHz).

The relationship between the VCO oscillator frequency Ofreq and the tuning-voltage Vtune for the VCO circuit with varactor biasing 382 is shifted relative to the varactor without biasing 380, due to the presence of the offset-voltage Voffset. In this example, the offset-voltage Voffset is equal to the minimum-operating-voltage 384 of the charge-pump. The VCO circuit with varactor biasing 382 still has a minimum-tuning-voltage Vtune_min defined by the minimum-operating-voltage 384, that is 0.62 V. However, the varactor-voltage, based on the difference between the tuning-voltage Vtune and the offset-voltage Voffset can determines the oscillator-frequency Ofreq. The minimum-tuning-voltage Vtune_min now corresponds to an oscillator-frequency of 46.2 GHz (illustrated at point B in Figure). The maximum-tuning-voltage Vtune_max is based on the sum of the maximum-VCO-voltage (4.4V) and the offset-voltage Voffset (0.6V), that is 5 V. In this way, the maximum-tuning-voltage Vtune still corresponds to an oscillator frequency of 49 GHz (illustrated at point C in Figure). The minimum-tuning-voltage Vtune_min and the maximum-tuning-voltage Vtune_max therefore correspond to an oscillator-frequency-range of 46.2 GHz to 49 GHz (~2.8 GHz).

The VCO circuit without varactor biasing 380 cannot access the oscillation bandwidth A that corresponds to a tuning voltage less than the minimum-operating-voltage 384 of the charge pump. The VCO circuit with varactor biasing 382 has gained this bandwidth due to the use of the offset-voltage source. Point B in FIG. 3 illustrates how the oscillator-frequency dependence of the minimum-tuning-voltage Vtune has been translated (with the offset-voltage Voffset) to allow for the minimum-operating-voltage 384 of the charge-pump. In other words, the tuning range is increased thanks to the Vtune translation (Vtune_min>V_charge_pump_min). In this example, the bandwidth gain is approximately 0.9 GHz (2.8 GHz-1.9 GHz). A 1.8 GHz bandwidth gain can be obtained at oscillation frequencies at 77 GHz.

Figure 4:
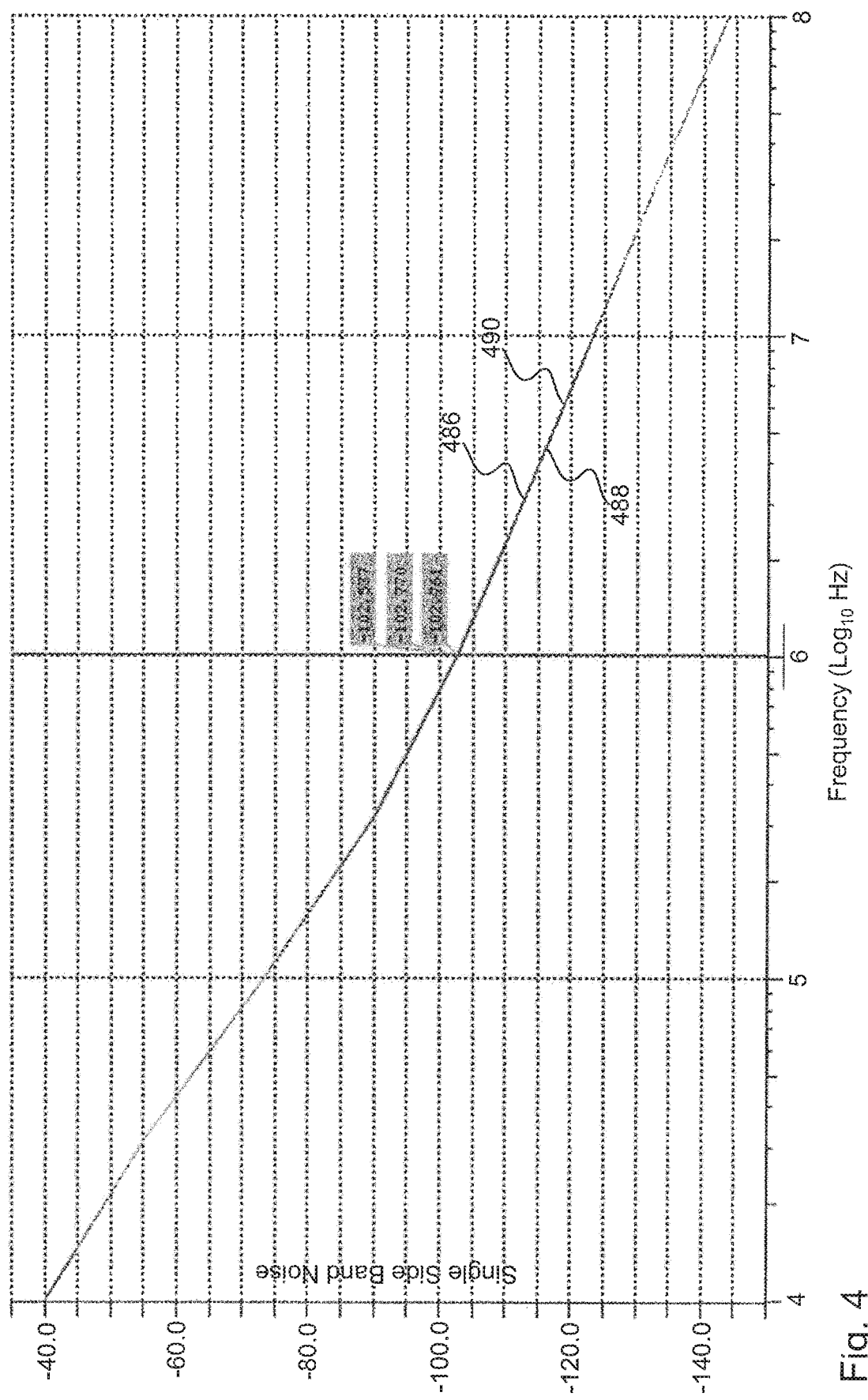
FIG. 4 shows plots of phase noise against oscillator frequency for various VCO circuits.

FIG. 4 illustrates simulated plots of phase noise against oscillator frequency for: (i) a typical VCO 486 (intrinsic VCO phase noise); (ii) a VCO with an offset-voltage provided by an offset-voltage-source 488; and (iii) a VCO with an offset-voltage provided by an offset-voltage-source in which the simulated output noise of the offset-voltage-source has been degraded by 10 dB 490. The three plots are almost indistinguishable, illustrating that there is no VCO phase noise degradation due to the presence of the offset-voltage provided by the offset-voltage-source. The offset-voltage-source could therefore be provided with relaxed noise requirements enabling die size to be reduced.

Figure 5:
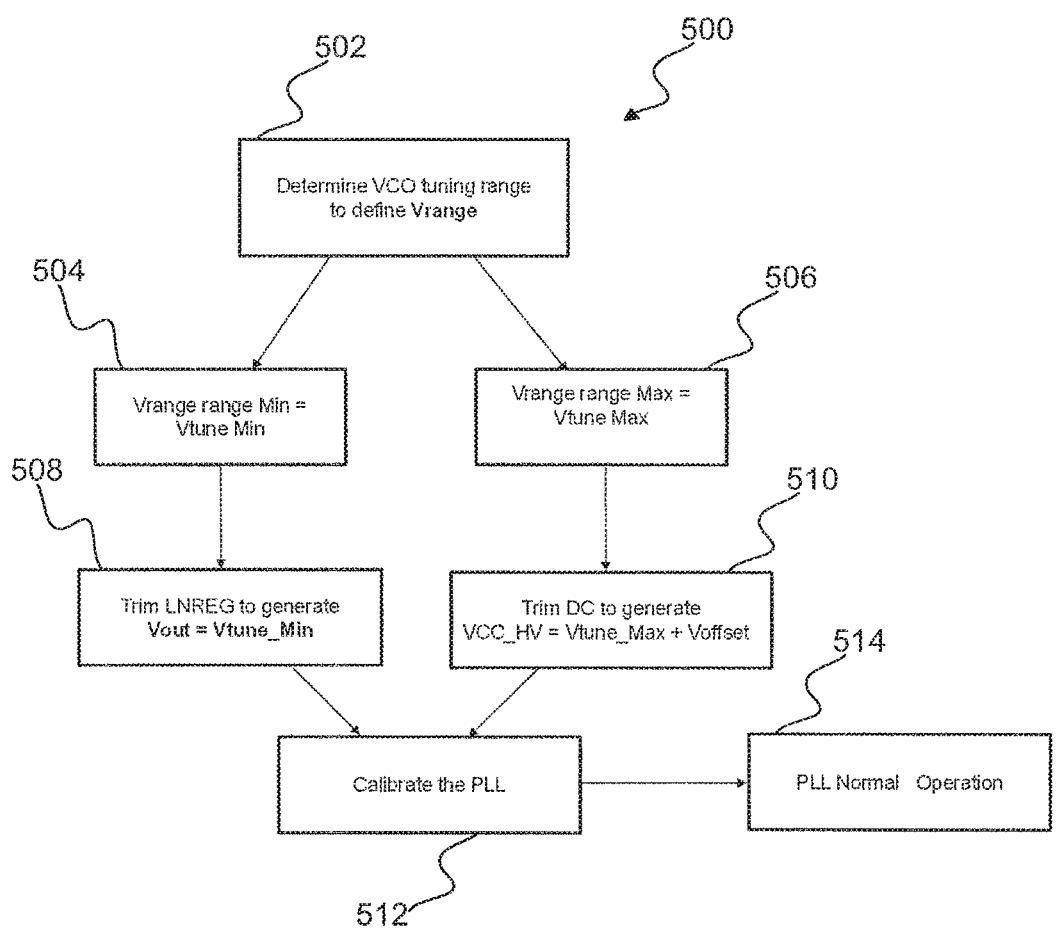
FIG. 5 shows a flowchart for a method of voltage generation before calibrating a phased-locked loop with extended tuning range.

FIG. 5 illustrates a flowchart for a method 500 of voltage generation before calibrating a phased-locked loop with extended tuning range, such as that described with reference to FIG. 1. A tuning-range Vrange is defined 502 for the VCO. The tuning-range Vrange is defined between the limits of the minimum-VCO-voltage and the maximum-VCO-voltage. The minimum-VCO-voltage is set 504 as the minimum-operating-voltage of the charge pump of the VCO.

A linear voltage regulator is trimmed 508 to provide an offset-voltage that is equal to the minimum-operating-voltage of the charge pump of the VCO. A power supply is trimmed 510 to generate a high-voltage VCC_HV that is equal to the maximum-VCO-voltage plus the offset-voltage. The PLL is then calibrated 512 in a conventional and the PLL is subsequently available for normal operation 514.

An oscillator-frequency of a typical VCO is based on the tuning-voltage Vtune. However, the minimum-operating-voltage is typically greater than the minimum-VCO-voltage, which results in a loss of operating range. In the present case, the VCO 202' is configured to provide an oscillator-frequency in accordance with the offset-voltage Voffset, in addition to the tuning-voltage Vtune. In this way, the minimum-operating-voltage of the charge-pump 204' can be compensated for using the offset-voltage Voffset provided by the offset-voltage-source 206', resulting in an increase in an operating range of the oscillator frequency Ofreq provided by the VCO 202'.

A radar transceiver may be provided that comprises the phase-locked loop (PLL) system of FIG. 1, or the voltage-controlled-oscillator circuit of FIG. 2a or 2b. In such examples, the charge-pump of the voltage-controlled-oscillator circuit is configured to provide the tuning-voltage based on an output-signal from the phase-comparator of the PLL. Such a radar transceiver may have a single VCO for operating within either a first frequency band or a second frequency band. The single VCO may have an oscillator-frequency-range of greater than 3 GHz, or even 5 GHz.

Some example voltage-controlled-oscillators in accordance with the present disclosure to therefore overcome the min Vtune limitation for the charge pump and handle the high Vtune operation with the charge pump preventing the avalanche noise multiplication. This enables a single VCO to cover both Radar bands (76-77 GHz, 77-81 GHz). In addition, complete VCO tuning range can be used to lock the PLL. Therefore, yield at probe level may be improved and fast and stable switching between frequency bands can be enabled using the single VCO.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description, In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums.

Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A voltage-controlled-oscillator circuit comprising:
    a charge-pump configured to generate a tuning-voltage, the tuning-voltage having a minimum-operating-voltage;
    an offset-voltage-source configured to generate an offset-voltage in accordance with the minimum-operating-voltage; and
    a voltage-controlled-oscillator, VCO, configured to provide an oscillator frequency in accordance with the tuning-voltage and the offset-voltage, the voltage-controlled-oscillator having a minimum-VCO-voltage, and the offset-voltage is based on a difference between the minimum-VCO-voltage and the minimum-operating-voltage of the tuning-voltage.

2. The voltage-controlled-oscillator circuit of claim 1 in which the voltage-controlled-oscillator comprises at least one varactor unit, in which a varactor-voltage based on the offset-voltage is applied across a varactor of the at least one varactor unit.

3. The voltage-controlled-oscillator circuit of claim 2 in which the varactor-voltage is based on a difference between the tuning-voltage and the offset-voltage.

4. The voltage-controlled-oscillator circuit of claim 2 in which each of the at least one varactor units comprises a pair of varactors.

5. The voltage-controlled-oscillator circuit of claim 1 in which the voltage-controlled-oscillator has a maximum-VCO-voltage, the voltage-controlled-oscillator circuit comprising a high-voltage-supply configured to provide a high-voltage to the charge-pump, wherein the high-voltage is based on a sum of the maximum-VCO-voltage and the offset-voltage.

6. The voltage-controlled-oscillator circuit of claim 5 in which the high-voltage is larger than the sum of the maximum-VCO-voltage and the offset-voltage.

7. The voltage-controlled-oscillator circuit of claim 1 in which the offset-voltage-source comprises a low-noise-regulator.

8. The voltage-controlled-oscillator circuit of claim 1 further comprising a temperature-compensation-circuit configured to provide a temperature-compensation-voltage to the voltage-controlled-oscillator.

9. The voltage-controlled-oscillator circuit of claim 8 in which the temperature-compensation-voltage is provided to a different varactor-unit to the tuning-voltage.

10. The voltage-controlled-oscillator circuit of claim 8 in which the offset-voltage is a first-offset-voltage, in which the offset-voltage-source is further configured to generate a second-offset-voltage in accordance with a temperature-compensation-minimum-operating-voltage of the temperature-compensation-circuit, in which the offset-voltage-source is configured to provide the first-offset-voltage to a different varactor unit to the second-offset-voltage.

11. The voltage-controlled-oscillator circuit of claim 10, in which the first-offset-voltage and the second-offset-voltage are fixed DC voltages.

12. A phase-locked loop (PLL) system comprising:
a phase-comparator; and
a voltage-controlled-oscillator circuit comprising:
  a charge-pump configured to generate a tuning-voltage, the tuning-voltage having a minimum-operating-voltage;
  an offset-voltage-source configured to generate an offset-voltage in accordance with the minimum-operating-voltage; and
  a voltage-controlled-oscillator, VCO, configured to provide an oscillator frequency in accordance with the tuning-voltage and the offset-voltage, the VCO having a minimum-VCO-voltage, and the offset-voltage is based on a difference between the minimum-VCO-voltage and the minimum-operating-voltage of the tuning-voltage;
wherein the charge-pump is configured to provide the tuning-voltage based on an input-voltage received by the charge pump, and wherein the input-voltage is based on an output-signal from the phase-comparator.

13. A radar transceiver comprising:
a phase-comparator; and
a voltage-controlled-oscillator circuit comprising:
  a charge-pump configured to generate a tuning-voltage, the tuning-voltage having a minimum-operating-voltage;
  an offset-voltage-source configured to generate an offset-voltage in accordance with the minimum-operating-voltage; and
  a voltage-controlled-oscillator, VCO, configured to provide an oscillator frequency in accordance with the tuning-voltage and the offset-voltage, wherein the VCO has a minimum-VCO-voltage, and wherein the offset-voltage is based on a difference between the minimum-VCO-voltage and the minimum-operating-voltage of the tuning-voltage;
wherein the charge-pump is configured to provide the tuning-voltage based on an input-voltage received by the charge-pump, wherein the input-voltage is based on an output-signal from the phase-comparator, and wherein the VCO is configured for operating within either a first frequency band or a second frequency band.

14. The radar transceiver of claim 13 in which the VCO has an oscillator-frequency-range of 5 GHz or more.

15. The radar transceiver of claim 13, wherein the VCO comprises at least one varactor unit, wherein a varactor-voltage based on the offset-voltage is applied across a varactor of the at least one varactor unit.

16. The radar transceiver of claim 13, wherein the VCO has a maximum-VCO-voltage, the voltage-controlled-oscillator circuit comprising a high-voltage-supply configured to provide a high-voltage to the charge-pump, wherein the high-voltage is based on a sum of the maximum-VCO-voltage and the offset-voltage.

17. The radar transceiver of claim 13, wherein the voltage-controlled-oscillator circuit further comprising a temperature-compensation-circuit configured to provide a temperature-compensation-voltage to the VCO.

18. The radar transceiver of claim 17, wherein the offset-voltage is a first-offset-voltage, wherein the offset-voltage-source is further configured to generate a second-offset-voltage in accordance with a temperature-compensation-minimum-operating-voltage of the temperature-compensation-circuit, and wherein the offset-voltage-source is configured to provide the first-offset-voltage to a different varactor unit to the second-offset-voltage.

19. A voltage-controlled-oscillator circuit comprising:
a charge-pump configured to generate a tuning-voltage, the tuning-voltage having a minimum-operating-voltage;
an offset-voltage-source configured to generate an offset-voltage in accordance with the minimum-operating-voltage; and
a voltage-controlled-oscillator, VCO, configured to provide an oscillator frequency in accordance with the tuning-voltage and the offset-voltage, the voltage-controlled-oscillator having a maximum-VCO-voltage, the voltage-controlled-oscillator circuit comprising a high-voltage-supply configured to provide a high-voltage to the charge-pump, wherein the high-voltage is based on a sum of the maximum-VCO-voltage and the offset-voltage.

20. A radar transceiver comprising:
a phase-comparator; and
a voltage-controlled-oscillator circuit comprising:
  a charge-pump configured to generate a tuning-voltage, the tuning-voltage having a minimum-operating-voltage;
  an offset-voltage-source configured to generate an offset-voltage in accordance with the minimum-operating-voltage; and
  a voltage-controlled-oscillator, VCO, configured to provide an oscillator frequency in accordance with the tuning-voltage and the offset-voltage, the VCO having a maximum-VCO-voltage, the voltage-controlled-oscillator circuit comprising a high-voltage-supply configured to provide a high-voltage to the charge-pump, wherein the high-voltage is based on a sum of the maximum-VCO-voltage and the offset-voltage;
wherein the charge-pump is configured to provide the tuning-voltage based on an input-voltage received by the charge-pump, wherein the input-voltage is based on an output-signal from the phase-comparator, and wherein the VCO is configured for operating within either a first frequency band or a second frequency band.

* * * * *